United States Patent
Sakuma

(10) Patent No.: US 10,116,121 B2
(45) Date of Patent: Oct. 30, 2018

(54) SEMICONDUCTOR DEVICE MANUFACTURING METHOD AND SEMICONDUCTOR DEVICE

(71) Applicant: Mitsubishi Electric Corporation, Tokyo (JP)

(72) Inventor: Hitoshi Sakuma, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/070,669

(22) Filed: Mar. 15, 2016

(65) Prior Publication Data
US 2016/0329684 A1    Nov. 10, 2016

(30) Foreign Application Priority Data
May 8, 2015    (JP) .................................. 2015-095800

(51) Int. Cl.
*H01S 5/227* (2006.01)
*H01S 5/02* (2006.01)
(Continued)

(52) U.S. Cl.
CPC .......... *H01S 5/2275* (2013.01); *H01S 5/0201* (2013.01); *H01S 5/2222* (2013.01); *H01S 5/323* (2013.01); *H01S 2301/176* (2013.01)

(58) Field of Classification Search
CPC ................. H01S 5/2275; H01S 5/2277; H01S 5/22–5/2228; H01L 21/78; H01L 21/782;
(Continued)

(56) References Cited

U.S. PATENT DOCUMENTS

| | | | | |
|---|---|---|---|---|
| 4,525,841 A | * | 6/1985 | Kitamura | ................ H01S 5/227 372/46.01 |
| 5,982,798 A | | 11/1999 | Okuda | |

(Continued)

FOREIGN PATENT DOCUMENTS

| | | |
|---|---|---|
| CN | 1697271 A | 11/2005 |
| JP | S63-151077 A | 6/1988 |

(Continued)

OTHER PUBLICATIONS

An Office Action; "Notification of Reasons for Refusal," issued by the Japanese Patent Office dated May 15, 2018, which corresponds to Japanese Patent Application No. 2015-095800 and is related to U.S. Appl. No. 15/070,669; with English language translation.

(Continued)

*Primary Examiner* — Joshua King
(74) *Attorney, Agent, or Firm* — Studebaker & Brackett PC

(57) ABSTRACT

A method of manufacturing a semiconductor device, includes a step of forming, on a semiconductor substrate, a mesa stripe including an active layer, and a semiconductor layer covering the mesa stripe, a masking step of forming, on the semiconductor layer, a mask pattern through which the semiconductor layer is exposed on opposite sides of the mesa stripe, an isotropic etching step of performing isotropic etching on the semiconductor layer exposed through the mask pattern so that concaves having a circular-arc sectional shape are formed in the semiconductor layer, and an anisotropic etching step of performing anisotropic etching on the semiconductor layer through the mask pattern after the isotropic etching step so that etching progresses to the semiconductor substrate.

9 Claims, 8 Drawing Sheets

(51) Int. Cl.
*H01S 5/22* (2006.01)
*H01S 5/323* (2006.01)

(58) Field of Classification Search
CPC ... H01L 21/784; H01L 21/82; H01L 21/8252; H01L 21/02019
See application file for complete search history.

(56) References Cited

U.S. PATENT DOCUMENTS

| | | | |
|---|---|---|---|
| 2003/0013261 A1 | 1/2003 | Ksano | |
| 2005/0254541 A1* | 11/2005 | Okuda | B82Y 20/00 372/96 |
| 2010/0220760 A1* | 9/2010 | Miyoshi | B82Y 20/00 372/45.01 |
| 2010/0295136 A1* | 11/2010 | Or-Bach | H01L 21/76254 257/390 |
| 2013/0337633 A1* | 12/2013 | Seddon | H01L 21/78 438/462 |
| 2016/0056080 A1* | 2/2016 | Takahashi | H01L 21/78 438/462 |
| 2016/0071767 A1* | 3/2016 | Hashimoto | H01L 21/78 257/620 |

FOREIGN PATENT DOCUMENTS

| | | |
|---|---|---|
| JP | 01-114092 A | 5/1989 |
| JP | 04-111488 A | 4/1992 |
| JP | H06-283483 A | 10/1994 |
| JP | H10-093190 A | 4/1998 |
| JP | 11-191654 | 7/1999 |
| JP | 2000-323787 A | 11/2000 |
| JP | 2003-101147 A | 4/2003 |
| JP | 2005-322849 A | 11/2005 |

OTHER PUBLICATIONS

An Office Action issued by the Chinese Patent Office dated Jun. 5, 2018, which corresponds to Chinese Patent Application No. 201610298648.0 and is related to U.S. Appl. No. 15/070,669; with English language translation.

* cited by examiner

SEMICONDUCTOR DEVICE MANUFACTURING METHOD AND SEMICONDUCTOR DEVICE

BACKGROUND OF THE INVENTION

Field of the Invention

The present invention relates to a method of manufacturing a semiconductor device having a mesa stripe and to the semiconductor device.

Background Art

With the emergence of the problem of an abrupt increase in communication traffic and the installation space and power consumption problems with base stations attributable to the expansions of mobile broadband services and the further expansions of internet services such as moving image distribution services or social network services due to the rapid proliferation of smartphones, a need for preparation of high-speed, large-capacity and high-efficiency optical network infrastructures in trunk systems and access systems has arisen for communication of large-capacity data. There is a demand for further increasing the speed of operation of semiconductor laser elements serving as light sources in the optical network.

As one of factors in determining the upper limit of the frequency of modulation of a semiconductor laser element, a reduction in the efficiency of current injection into the active region due to a parasitic impedance is be mentioned. To reduce the parasitic impedance, the width of the process mesa is reduced. Japanese Patent Laid-Open No. 11-191654 discloses a semiconductor laser element having a narrow mesa structure.

Forming a mesa stripe of a reduced width requires etching a semiconductor layer with high accuracy. Trenches on opposite sides of a mesa stripe are ordinarily formed by dry etching. If the trenches are formed by dry etching with anisotropy, both the bottom and side surfaces of each trench are made flat, and stress is concentrated in portions where the flat bottom surface and the flat side surfaces meet each other (hereinafter referred to as "angular portion"). As a result of this stress concentration, splitting of the substrate not from the dicing street but from a point in the angular portions at the time of chip separation and hence a reduction in yield can occur.

SUMMARY OF THE INVENTION

In view of the above-described problem, an object of the present invention is to provide a semiconductor device manufacturing method and a semiconductor device capable of forming a mesa stripe of a reduced width and preventing splitting of a substrate at either of the peripheries of trenches on opposite sides of the mesa stripe.

The features and advantages of the present invention may be summarized as follows.

According to one aspect of the present invention, a method of manufacturing a semiconductor device, includes a step of forming, on a semiconductor substrate, a mesa stripe including an active layer, and a semiconductor layer covering the mesa stripe, a masking step of forming, on the semiconductor layer, a mask pattern through which the semiconductor layer is exposed on opposite sides of the mesa stripe, an isotropic etching step of performing isotropic etching on the semiconductor layer exposed through the mask pattern so that concaves having a circular-arc sectional shape are formed in the semiconductor layer, and an anisotropic etching step of performing anisotropic etching on the semiconductor layer through the mask pattern after the isotropic etching step so that etching progresses to the semiconductor substrate.

According to another aspect of the present invention, a method of manufacturing a semiconductor device, includes a step of forming, on a semiconductor substrate, a mesa stripe including an active layer, and a semiconductor layer covering the mesa stripe, a masking step of forming, on the semiconductor layer, a mask pattern through which the semiconductor layer is exposed on opposite sides of the mesa stripe, a resist step of forming a resist having concaves having a circular-arc sectional shape on the semiconductor layer exposed through the mask pattern, and an anisotropic etching step of etching a surface of the semiconductor substrate by progressing etching on the resist and on the semiconductor layer below the resist by means of anisotropic etching such that a ratio of the rate of etching on the semiconductor layer and the semiconductor substrate and the rate of etching on the resist is 1:1.

According to another aspect of the present invention, a method of manufacturing a semiconductor device, includes a step of forming, on a semiconductor substrate, a mesa stripe including an active layer, and a semiconductor layer covering the mesa stripe, a masking step of forming, on the semiconductor layer, a mask pattern through which the semiconductor layer is exposed on opposite sides of the mesa stripe, an anisotropic etching step of performing anisotropic etching on the semiconductor layer exposed through the mask pattern so that etching progresses to the semiconductor substrate, and a mass transport step of causing, after the anisotropic etching step, by heating the semiconductor substrate, a mass transport phenomenon on the semiconductor substrate exposed at bottom surfaces of trenches formed in the anisotropic etching step.

According to another aspect of the present invention, a method of manufacturing a semiconductor device, includes a growth step of growing, on a semiconductor substrate, a mesa stripe including an active layer, and a semiconductor layer covering the mesa stripe, a masking step of forming, on the semiconductor layer, a mask pattern through which the semiconductor layer is exposed on opposite sides of the mesa stripe, an anisotropic etching step of performing anisotropic etching on the semiconductor layer exposed through the mask pattern so that etching progresses to the semiconductor substrate, and simultaneously forming a protective film on side surfaces of the semiconductor layer formed by etching, and an isotropic etching step of isotropically etching the semiconductor substrate by such etching that the rate of etching on the semiconductor substrate is higher than the rate of etching on the protective film.

According to another aspect of the present invention, a semiconductor device includes a semiconductor substrate, a mesa stripe including an active layer provided on the semiconductor substrate, and a semiconductor layer provided on the semiconductor substrate and having trenches on opposite sides of the mesa stripe, the semiconductor substrate being exposed through the trenches, wherein the semiconductor substrate at each of the bottoms of the trenches is concaved.

Other and further objects, features and advantages of the invention will appear more fully from the following description.

DETAILED DESCRIPTION OF THE PREFERRED EMBODIMENTS

Figure 1:
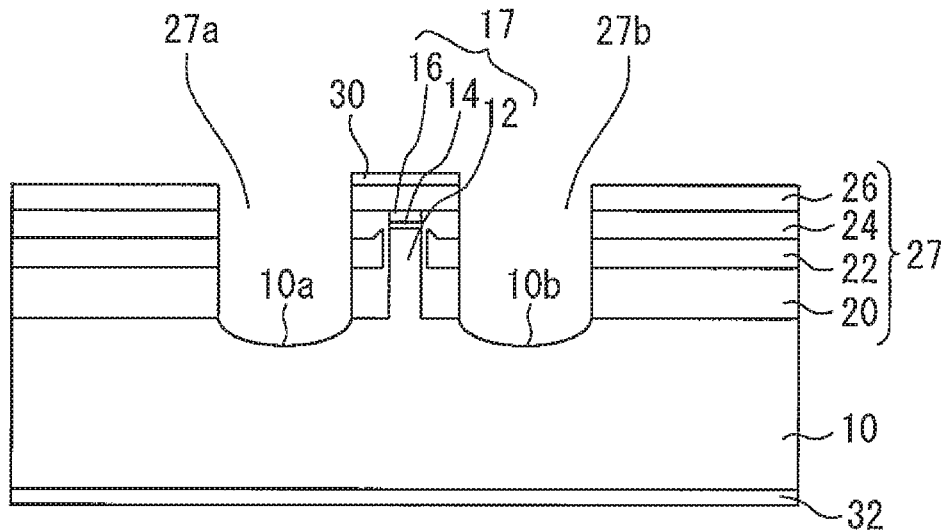
FIG. 1 is a sectional view of a semiconductor device according to a first embodiment.

A semiconductor device manufacturing method and a semiconductor device according to an embodiment of the present invention will be described with reference to the accompanying drawings. Components identical or corresponding to each other are indicated by the same reference characters and repeated description of them is omitted in some cases.

First Embodiment

FIG. 1 is a sectional view of a semiconductor device according to a first embodiment of the present invention. The semiconductor device has a semiconductor substrate 10 formed, for example, of an n-type InP. A mesa stripe 17 is formed on the semiconductor substrate 10. The mesa stripe 17 has an n-type lower cladding layer 12, an active layer 14 formed on the lower cladding layer 12, and a p-type upper cladding layer 16 formed on the active layer 14.

A semiconductor layer 27 is formed on opposite sides of the mesa stripe 17 on the semiconductor substrate 10. The semiconductor layer 27 includes a p-type layer 20, an n-type layer 22 formed on the p-type layer 20, a p-type layer 24 formed on the n-type layer 22, and a p-type contact layer 26 formed on the p-type layer 24 and the mesa stripe 17. The p-type layer 20, the n-type layer 22 and the p-type layer 24 function as a current blocking layer. Thus, the semiconductor layer 27 has blocking layers in contact with side surfaces of the mesa stripe 17, and the contact layer 26 formed on the mesa stripe 17 and the blocking layers. The semiconductor layer 27 is formed, for example, of an InP-based material. The semiconductor layer 27 covers the mesa stripe 17.

Trenches 27a and 27b in which the semiconductor substrate 10 is exposed are formed in the semiconductor layer 27. The semiconductor substrate (bottom surfaces 10a and 10b of the trenches) exposed at the bottoms of the trenches 27a and 27b are concaved. Each of the bottom surfaces 10a and 10b of the trenches 27a and 27b has a circular-arc sectional shape. The corresponding circular-arc portion of the semiconductor substrate is thinnest at its center and thickest at its end. Since the bottom surfaces 10a and 10b of the trenches 27a and 27b have a circular-arc sectional shape, the bottom surfaces and the side surfaces of the trenches 27a and 27b connect smoothly to each other. The inner walls of the trenches 27a and 27b have no angular portions. Also, the side surfaces of the trenches 27a and 27b are flat surfaces perpendicular to the semiconductor substrate 10.

A p-side electrode 30 is formed on the mesa stripe 17, with the contact layer 26 interposed therebetween. An n-side electrode 32 is formed on the back surface of the semiconductor substrate 10. When the semiconductor device is operated, a voltage is applied between the p-side electrode 30 and the n-side electrode 32 to emit laser light in the back-to-front direction or the front-to-back direction perpendicular to the plane of projection of FIG. 1.

Figure 2:
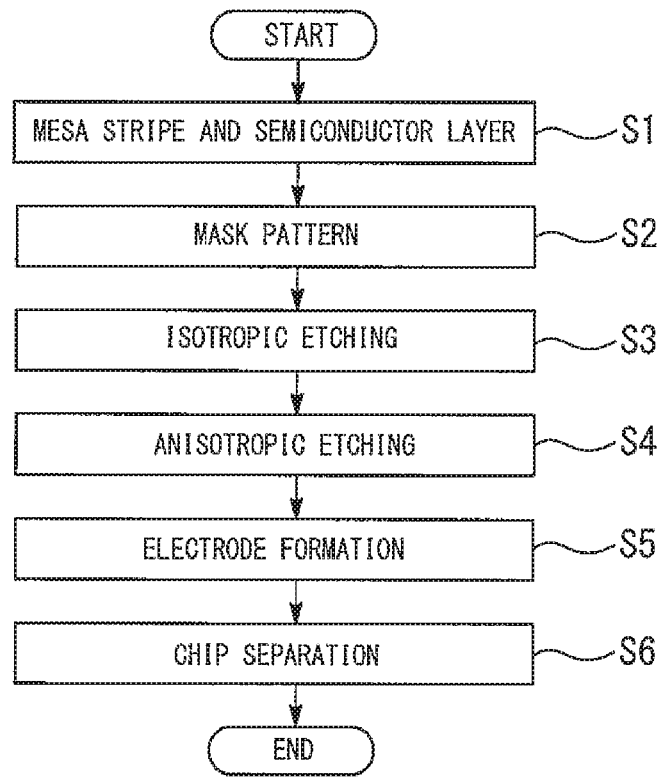
FIG. 2 is a flowchart.
Figure 3:
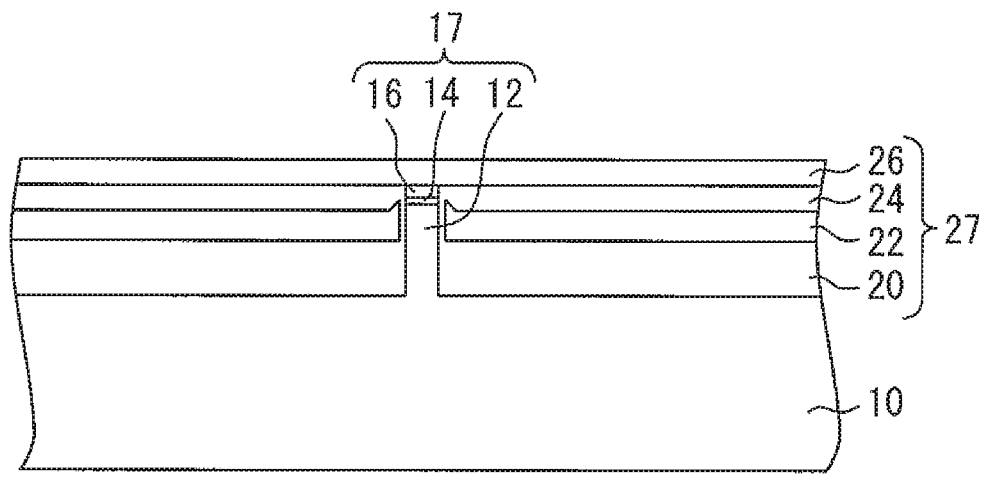
FIG. 3 is a sectional view of the semiconductor device in manufacturing processes.

A method of manufacturing the semiconductor device according to the first embodiment of the present invention will subsequently be described. FIG. 2 is a flowchart showing a method of manufacturing the semiconductor device. The mesa stripe and the semiconductor layer are first formed on the semiconductor substrate (step S1). FIG. 3 is a sectional view of the semiconductor device having the mesa stripe 17 and the semiconductor layer 27 formed on the semiconductor substrate 10. The mesa stripe 17 is covered with the semiconductor layer 27.

Figure 4:
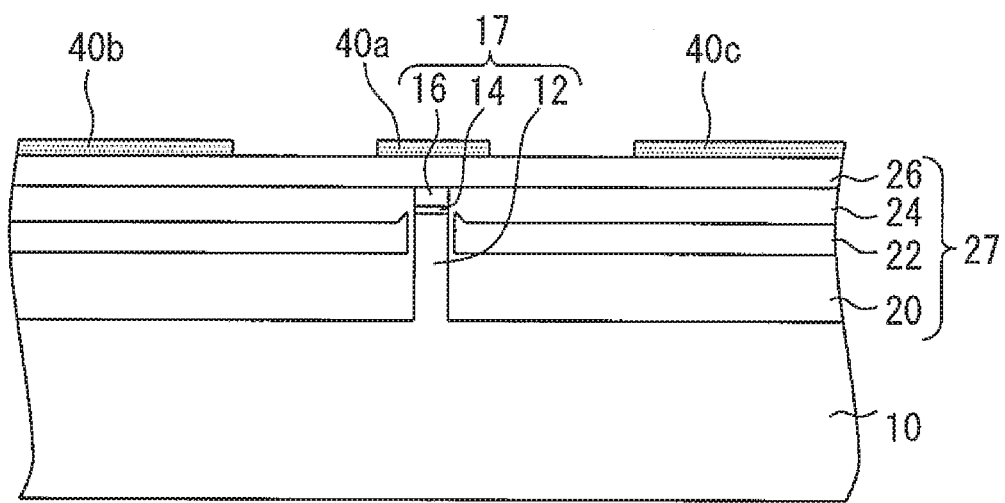
FIG. 4 is a sectional view of the semiconductor device in manufacturing processes.

The process then advances to step S2. In step S2, a mask pattern is formed on the semiconductor layer. FIG. 4 is a sectional view of the semiconductor device with the mask pattern portions 40a, 40b, and 40c formed thereon. The material of the mask pattern portions 40a, 40b, and 40c are, for example, an insulating film or a resist. The mask pattern portions 40a, 40b, and 40c allow the semiconductor layer to be exposed on opposite sides of the mesa stripe 17. This process step is referred to as a masking step.

Figure 5:
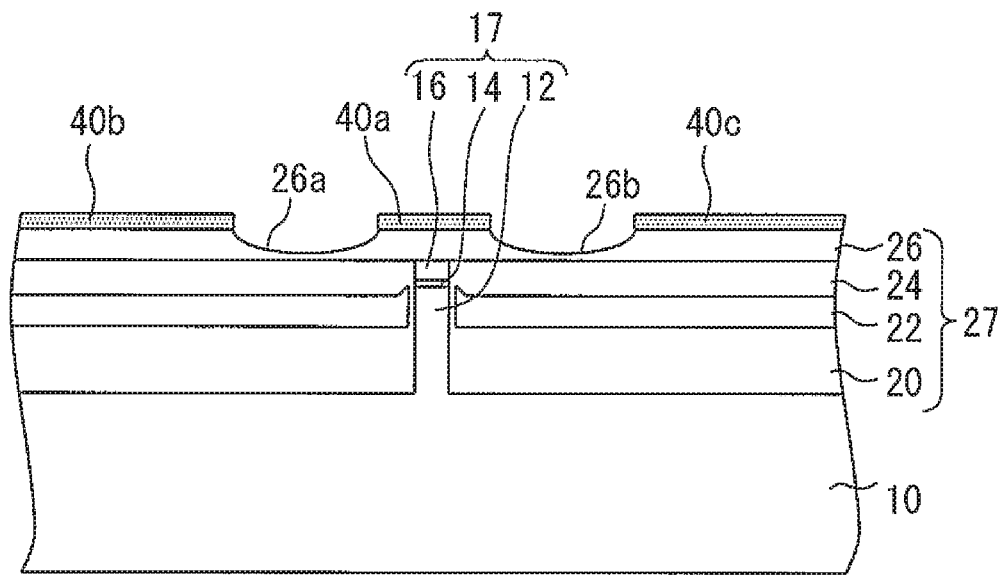
FIG. 5 is a sectional view of the semiconductor device in manufacturing processes.

The process then advances to step S3. In step S3, isotropic etching is performed on the semiconductor layer exposed through the mask pattern. This process step is referred to as an isotropic etching step. FIG. 5 is a sectional view of the semiconductor device after the isotropic etching step. In the isotropic etching step, concaves 26a and 26b each having a circular-arc sectional shape are formed in the contact layer 26 by using an etchant containing, for example, Br and $CH_3OH$. The isotropic etching step is wet processing. However, dry processing may alternatively be performed to carry out the isotropic etching step if isotropic etching is possible.

Figure 6:
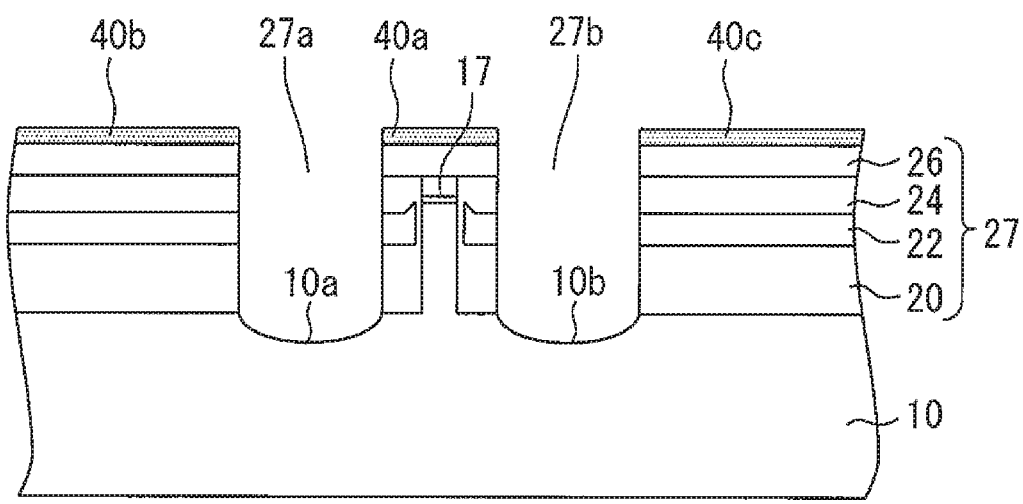
FIG. 6 is a sectional view of the semiconductor device in manufacturing processes.

The process then advances to step S4. In step S4, anisotropic etching is performed on the semiconductor layer exposed through the mask pattern. This process step is referred to as an anisotropic etching step. FIG. 6 is a sectional view of the semiconductor device after the anisotropic etching step. In the anisotropic etching step, etching progresses to the semiconductor substrate 10, with the mask pattern portions 40a, 40b, and 40c used as a mask. In the anisotropic etching step, etching progresses mainly in the depth direction of the semiconductor layer 27, while etching in sidewise directions along the semiconductor layer 27 is inhibited. The anisotropic etching step is dry processing. However, wet processing may alternatively be performed to carry out the anisotropic etching step if anisotropic etching is possible.

Anisotropic etching progresses, while the circular-arc concaved shape formed in the contact layer 26 in the isotropic etching step is maintained. That is, from the beginning to the end of anisotropic etching, the circular-arc concaves are maintained in the bottom surfaces of the trenches 27a and 27b. The side surfaces of the blocking layers (p-type layer 20, n-type layer 22, p-type layer 24) appearing as a result of the anisotropic etching step are surfaces perpendicular to the semiconductor substrate 10.

No angular portions exist in the inner walls of the trenches 27a and 27b formed in the anisotropic etching step. More specifically, the bottom surfaces 10a,10b of the trenches 27a and 27b and the side surfaces of the trenches 27a and 27b are smoothly connected to each other, so that the trenches 27a and 27b having no angular portions in their inner walls are formed.

Figure 7:
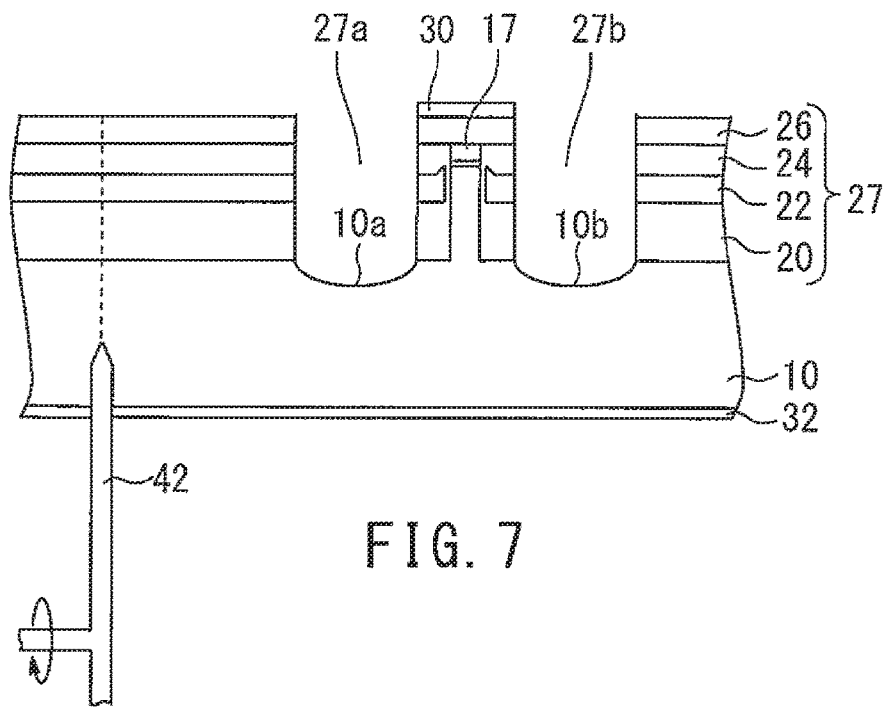
FIG. 7 is a sectional view of the semiconductor device in manufacturing processes.

The process then advances to step S5. In step S5, the mask pattern portions 40a, 40b, and 40c are removed. The p-side electrode and the n-side electrode are thereafter formed. FIG. 7 is a sectional view of the semiconductor device with the electrodes formed thereon. The above-described process steps are executed on the semiconductor device in the wafer state.

The process then advances to step S6. In step S6, the wafer is diced (or cleaved) into a plurality of chips. In this step, a dicing line for the semiconductor device (indicated by a broken line) is cut by using, for example, a dicing saw 42 shown in FIG. 7. Dicing is performed to separate the substrate into chips. At this time, since no angular portions exist in the inner walls of the trenches 27a and 27b, stress is not concentrated at the peripheries of the trenches 27a and 27b; dicing can be progressed along the dicing line determined in advance. When this chip separating operation is finished, the semiconductor device shown in FIG. 1 is completed.

High-speed response is required of semiconductor devices for communication use. It is, therefore, important to reduce the element capacitance. Reducing the element capacitance requires reducing the width of the mesa stripe. In the method of manufacturing the semiconductor device according to the first embodiment of the present invention, the trenches are formed by anisotropic etching and the mesa stripe having a reduced width can therefore be formed. Since anisotropic etching is performed to progress etching of the semiconductor layer, variation in width of the mesa stripe can be reduced in comparison with the case of isotropic etching.

Since the concaves are formed in the contact layer in the isotropic etching step, the trenches 27a and 27b having no angular portions in their inner walls can be formed. Concentration of stress at the peripheries of the trenches at the time of chip separation can therefore be avoided and splitting of the substrate from a point on the peripheries of the trenches can be inhibited, thus achieving an improvement in yield.

The semiconductor device manufacturing method and the semiconductor device according to the first embodiment of the present invention can be variously modified within such a scope that their features are not lost. For example, in the isotropic etching step, forming concaves having a circular-arc sectional shape in the semiconductor layer may suffice. Accordingly, the concaves may be formed in any of the layers other than the semiconductor layer. Also, the layers constituting the semiconductor layer 27 may be changed as desired. A new layer may be added to the mesa stripe 17 and to the semiconductor layer 27. A certain one of the layers may be removed. The conduction type of each layer constituting the semiconductor device may be reversed.

In the step of cutting the substrate to divide the wafer into chips, means other than the dicing saw may be used. As long as a mechanical force is exerted on the wafer at the time of dividing the wafer into chips, stress is caused on the peripheries of the trenches. Therefore the trench shape according to the present invention is effective. These modifications can be applied as desired to semiconductor device manufacturing methods and semiconductor devices according to embodiments described below. The semiconductor device manufacturing methods and semiconductor devices according to the embodiments described below have a number of commonalities with the first embodiment and will therefore be described mainly with respect to points of difference from the first embodiment.

Second Embodiment

Figure 8:
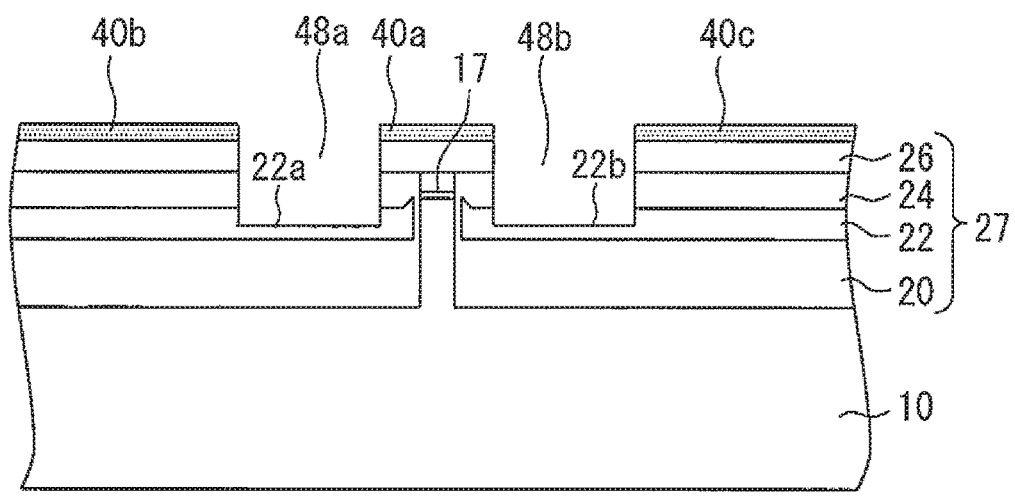
FIG. 8 is a sectional view of the semiconductor device with shallow trenches.

The method of manufacturing the semiconductor device according to the second embodiment will be described. The structure shown in FIG. 4 is first prepared. The mask pattern portions 40a, 40b, and 40c are formed by using an insulating film. Subsequently, shallow trenches are formed in the semiconductor layer. FIG. 8 is a sectional view of the semiconductor device with shallow trenches 48a and 48b formed for the semiconductor device. In this process step, anisotropic etching is performed on the semiconductor layer 27 exposed between the mask pattern portions 40a, 40b, and 40c to remove the semiconductor layer 27 within such an extent that the semiconductor substrate 10 is not exposed. This process step is referred to as a shallow trench forming step. The n-type layer 22, the p-type layer 24 and the contact layer 26 are exposed at the side surfaces of the shallow trenches 48a and 48b. The n-type layer 22 is exposed at bottom surfaces 22a and 22b of the shallow trenches 48a and 48b. The depth of the shallow trenches 48a and 48b may be changed.

Figure 9:
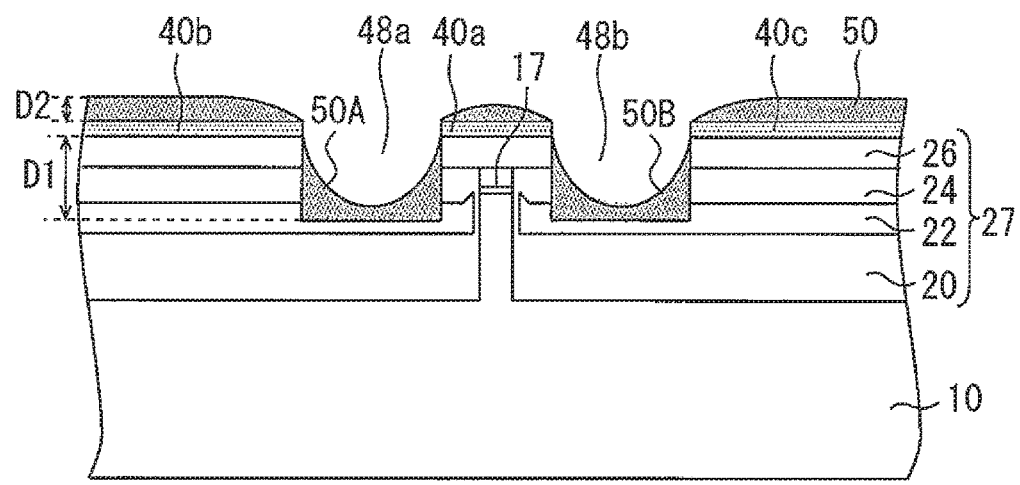
FIG. 9 is a sectional view of the semiconductor device with a resist.

Subsequently, a resist is formed on the semiconductor layer 27. FIG. 9 is a sectional view of the semiconductor device with a resist 50 formed thereon. The resist 50 is formed on the semiconductor layer 27 exposed between the mask pattern portions 40a, 40b, and 40c. In other words, resists 50A and 50B are formed in the shallow trenches 48a and 48b. The resists 50A and 50B have concaves having a circular-arc sectional shape. This resist forming is accompanied with resist forming on the mask pattern portions 40a, 40b, and 40c. The resist 50 is formed by dropping the resist 50 from a nozzle onto the semiconductor layer 27 and the mask pattern portions 40a, 40b, and 40c and by turning the substrate with a spin coater. A process step in which the resist 50 is formed in this way is referred to as a resist step.

The thickness of the resist 50 formed in the resist step is expressed by the thickness (D2) of the resist on the mask pattern portions 40a, 40b, and 40c. The depth of the shallow trenches 48a and 48b formed in the shallow trench forming step is D1. It is desirable to set the thickness D2 of the resist 50 to 1/10 to 1/2 (the figure on the right-hand side of "/" is a denominator and the figure on the left-hand side of "/" is a numerator) of the depth D1 of the shallow trenches 48a and 48b. If D2 is 10 to 50% of D1, the thickness of the resist at angular portions of the shallow trenches 48a and 48b can be increased and concaves having a circular-arc sectional shape can be provided in the resists 50A and 50B.

Subsequently, the resist 50 and portions of the semiconductor layer 27 and the semiconductor substrate 10 below the resists 50A and 50B are etched by anisotropic etching. This etching is anisotropic etching such that the ratio of the rate of etching on the semiconductor layer 27 and the semiconductor substrate 10 and the rate of etching on the resist 50 is 1:1. In a case where the semiconductor substrate 10 and the semiconductor layer 27 is formed of an InP-based material and the resist 50 is formed of an organic material, a mixture gas which is a mixture of a chlorine-based gas and argon, for example, is used as etching gas. This process step is referred to as an anisotropic etching step. This anisotropic etching is dry processing. However, wet processing by which anisotropic etching can be performed may alternatively be used.

In the anisotropic etching step, etching of the resist 50 and the semiconductor layer 27 below the resist 50 progresses to etch the surface of the semiconductor substrate 10. By anisotropic etching, the concaves having a circular-arc sectional shape formed on the resists 50A and 50B are transferred to the semiconductor substrate 10 without being changed in shape. That is, the bottom surfaces of the trenches formed by anisotropic etching are concaved, as are the bottom surfaces of the trenches 27a and 27b shown in FIG. 1. The mask pattern is thereafter removed and the electrodes are formed, thus manufacturing the semiconductor device shown in FIG. 1.

The semiconductor device manufacturing method according to the second embodiment of the present invention enables obtaining the resists 50A and 50B having concaves having a circular-arc sectional shape by only supplying a resist into the shallow trenches 48a and 48b and therefore enables omitting the isotropic etching performed in the first embodiment.

Third Embodiment

Figure 10:
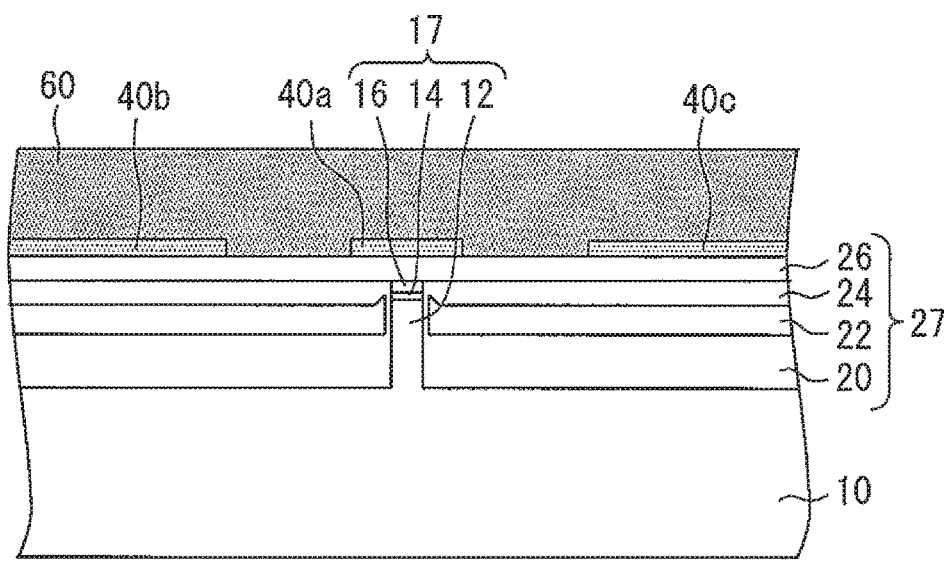
FIG. 10 is a sectional view of the semiconductor device with a resist.

The method of manufacturing the semiconductor device according to the third embodiment will be described. The structure shown in FIG. 4 is first prepared. The mask pattern portions 40a, 40b, and 40c are formed by using an insulating film. Subsequently, a resist is formed. FIG. 10 is a sectional view of the semiconductor device with a resist 60 formed thereon. The resist 60 is formed on the mask pattern portions 40a, 40b, and 40c and on the semiconductor layer 27 exposed through the mask pattern.

Figure 11:
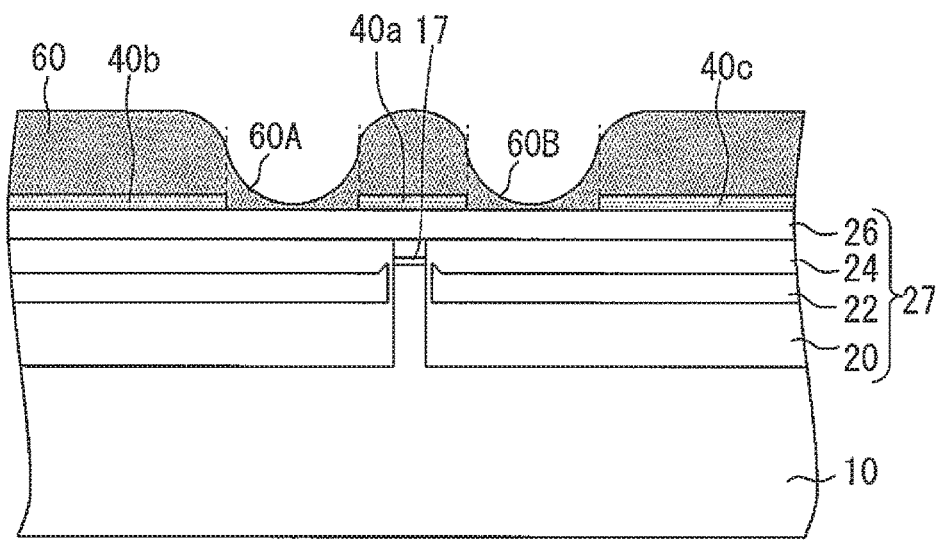
FIG. 11 is a sectional view of the semiconductor device in manufacturing processes.

Subsequently, exposure/development processing is performed on this resist 60. FIG. 11 is a sectional view of the semiconductor device after exposure/development processing. By exposure/development processing, concaves 60A and 60B are formed in the resists on the semiconductor layer of the opposite sides of the mesa stripe 17. Conditions for this exposure/development processing are determined so that the thickness of the resist is not zero at any position. The concaves 60A and 60B are positioned right above the openings between the mask pattern portions 40a, 40b, and 40c.

Subsequently, anisotropic etching is performed such that the ratio of the rate of etching on the semiconductor layer 27 and the semiconductor substrate 10 and the rate of etching on the resist 60 is 1:1. The mask pattern portions 40a, 40b, and 40c are thereafter removed and the electrodes are formed, thus manufacturing the semiconductor device shown in FIG. 1.

The semiconductor manufacturing methods according to the second and third embodiments have a commonality in that concaves having a circular-arc sectional shape are formed in a resist and anisotropic etching is performed on the resist to form trenches having concaves in their bottom surfaces. Because of this feature, the occurrence of splitting from any point in the bottom portions of the trenches at the time of chip separation can be avoided.

Fourth Embodiment

Figure 12:
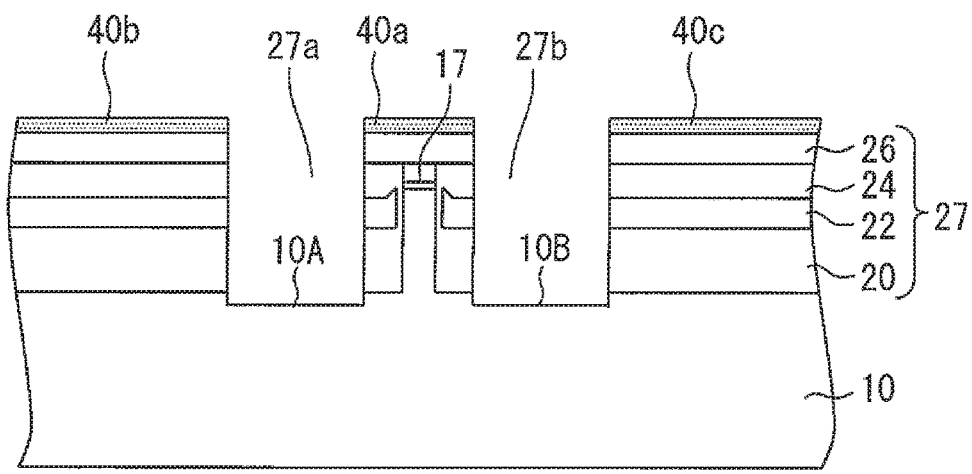
FIG. 12 is a sectional view of the semiconductor device in manufacturing processes.

The method of manufacturing the semiconductor device according to the fourth embodiment will be described. The structure shown in FIG. 4 is first prepared. Subsequently, anisotropic etching is performed on the semiconductor layer exposed through the mask pattern. FIG. 12 is a sectional view of the semiconductor device after anisotropic etching. A process step in which anisotropic etching is performed is referred to as an anisotropic etching step. Anisotropic etching progresses to the semiconductor substrate 10. By anisotropic etching, trenches 27a and 27b are formed on the opposite sides of the mesa stripe 17. Bottom surfaces 10A and 10B of the trenches 27a and 27b are flat surfaces. The side surfaces of the trenches 27a and 27b are also flat surfaces since anisotropic etching has been performed. Therefore, portions in which the bottom surfaces and the side surfaces of the trenches 27a and 27b meet each other are angular portions.

Figure 13:
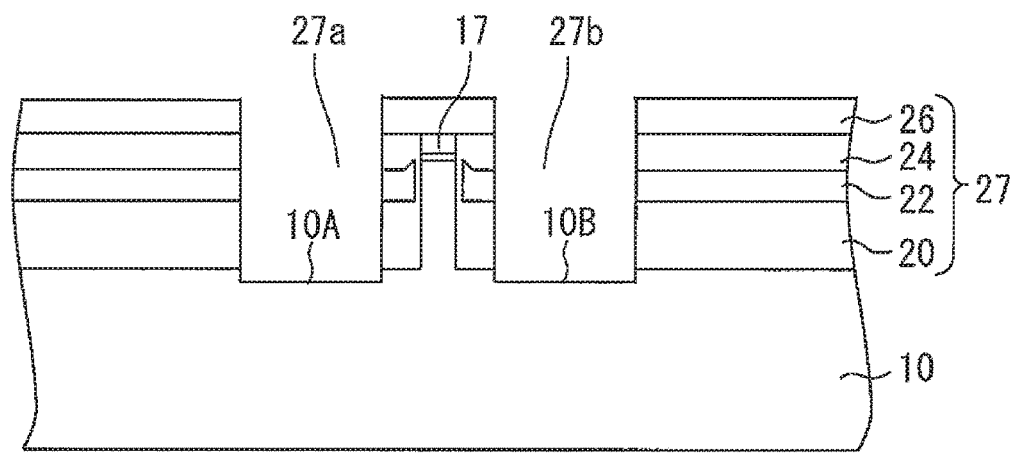
FIG. 13 is a sectional view of the semiconductor device after removal of the mask pattern.

Subsequently, the mask pattern is removed. FIG. 13 is a sectional view of the semiconductor device after removal of the mask pattern. Subsequently, the substrate is heated. More specifically, the substrate is subjected to a high temperature equal to or higher than 600° C. in a semiconductor crystal growth apparatus for processing such as MOCVD. A mass transport phenomenon is thereby caused on the semiconductor substrate exposed at the bottom surfaces 10A and 10B of the trenches formed in the anisotropic etching step. This process step is referred to as a mass transport step.

Figure 14:
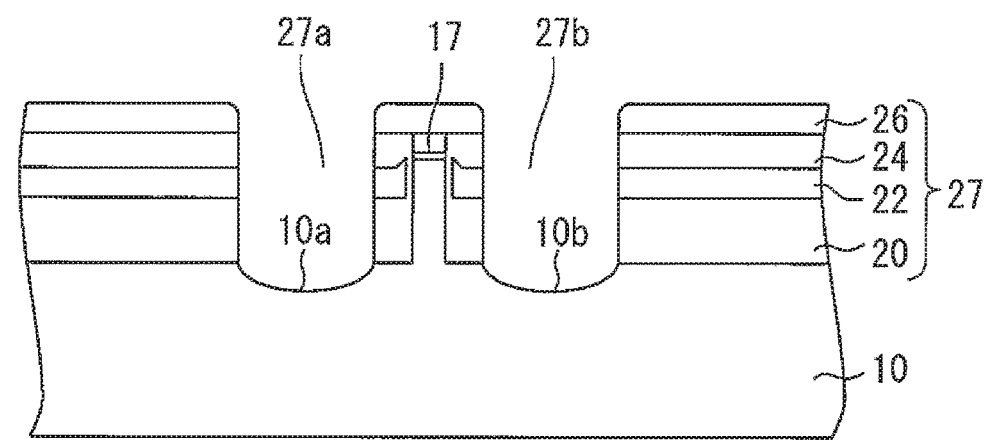
FIG. 14 is a sectional view of the semiconductor device after the mass transport step.

FIG. 14 is a sectional view of the semiconductor device after the mass transport step. By the mass transport step, the angular portions in the inner walls of the trenches 27a and 27b are removed and bottom surfaces 10a and 10b having concaves having a circular-arc sectional shape are formed. After the mass transport step, the substrate is separated into chips. At the time of chip separation, no substantial stress is caused at the peripheries of the trenches 27a and 27b, thus preventing splitting of the substrate at the peripheries of the trenches on opposite sides of the mesa stripe.

The temperature of the substrate in the mass transport step is not specially specified if the angular portions in the inner walls of the trenches 27a and 27b can be removed.

Fifth Embodiment

The method of manufacturing the semiconductor device according to the fifth embodiment will be described. The structure shown in FIG. 4 is first prepared. The mask pattern portions 40a, 40b, and 40c are formed by using an insulating film. Subsequently, anisotropic etching is performed on the semiconductor layer 27 exposed between the mask pattern portions 40a, 40b, and 40c. This process step is referred to as an anisotropic etching step. In the anisotropic etching step, an etching gas containing silicon is used.

Figure 15:
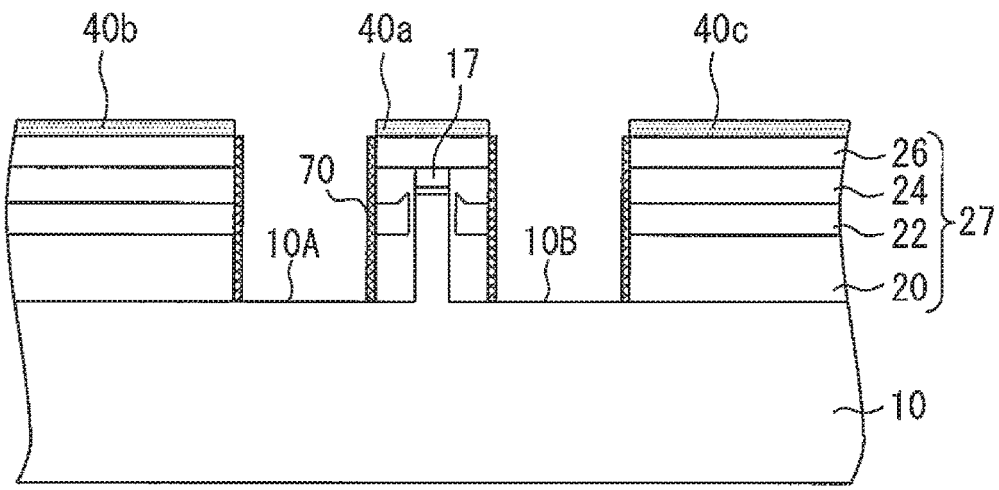
FIG. 15 is a sectional view of the semiconductor device after anisotropic etching.

FIG. 15 is a sectional view of the semiconductor device after anisotropic etching. During the progress of etching to the semiconductor substrate 10 in the anisotropic etching step, a protective film 70 is formed on side surfaces of the semiconductor layer formed by etching. The protective film 70 is film containing silicon (a reaction product containing Si).

Thereafter, the semiconductor substrate 10 is isotropically etched by such etching that the rate of etching on the semiconductor substrate 10 is higher than the rate of etching on the protective film 70. This process step is referred to as an isotropic etching step. In the isotropic etching step, an etchant containing, for example, Br and $CH_3OH$ is used.

Figure 16:
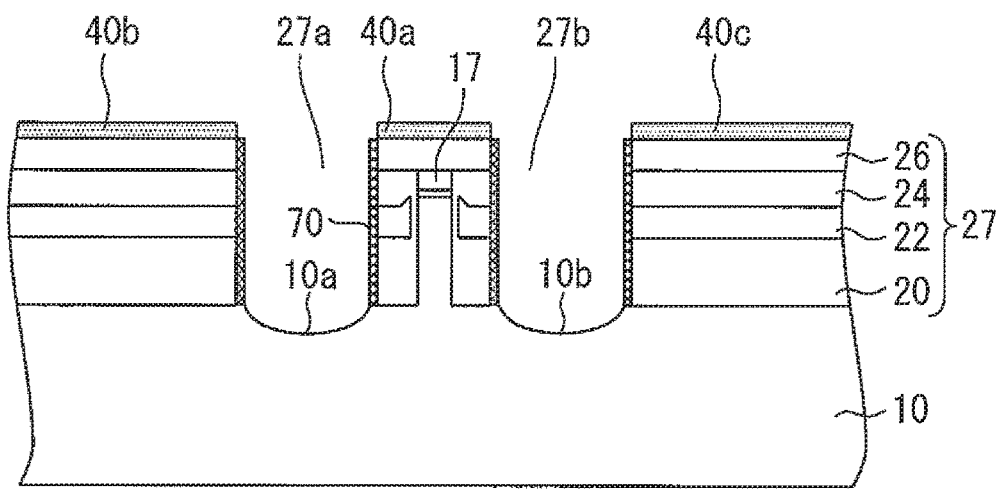
FIG. 16 is a sectional view of the semiconductor device after the isotropic etching step.

FIG. 16 is a sectional view of the semiconductor device after the isotropic etching step. In the isotropic etching step, the side surfaces of the semiconductor layer 27 protected with the protective film 70 is not largely etched while the semiconductor substrate 10 is isotropically etched. As a result, concaves 10a and 10b having a circular-arc sectional shape are formed as the bottom surfaces of the trenches 27a and 27b. The trenches 27a and 27b having no angular portions in their inner walls can thus be obtained. After isotropic etching, the protective film and the mask pattern are removed and the substrate is separated into chips.

As described above, the protective film 70 is formed on the side surfaces of the semiconductor layer 27 and isotropic etching is performed only on the bottom surfaces of the trenches. Concaves having a circular-arc sectional shape can thereby be formed on the bottom surfaces of the trenches.

While the material of the mask pattern portions 40a, 40b, and 40c is insulating film in the fifth embodiment of the present invention, the mask pattern may be formed of a resist. In the case where the mask pattern is formed of a resist, a protective film is formed on the side surfaces of the semiconductor layer while the semiconductor layer is being etched in the anisotropic etching step. This protective film is a film containing the resist (a reaction product containing the resist). After such a protective film is formed, the semiconductor substrate is isotropically etched by such etching that the rate of etching on the semiconductor substrate is higher than the rate of etching on the protective film. Thereafter, the protective film and the mask pattern are removed and the substrate is separated into chips.

A combination of the features of the embodiments described above may be made as appropriate.

According to the present invention, a mesa stripe of a reduced width can be formed by performing anisotropic etching and the substrate can be prevented from being split at either of the peripheries of the trenches on the opposite sides of the mesa stripe due to the concaved bottoms of the trenches.

Obviously many modifications and variations of the present invention are possible in the light of the above teachings. It is therefore to be understood that within the scope of the appended claims the invention may be practiced otherwise than as specifically described.

What is claimed is:

1. A method of manufacturing a semiconductor device, comprising:
   a step of forming, on a semiconductor substrate, a mesa stripe including an active layer, and a semiconductor layer covering the mesa stripe;
   a masking step of forming, on the semiconductor layer, a mask pattern through which the semiconductor layer is exposed on opposite sides of the mesa stripe;
   an isotropic etching step of performing isotropic etching on the semiconductor layer exposed through the mask pattern so that concaves having a circular-arc sectional shape are formed in the semiconductor layer;
   an anisotropic etching step of performing anisotropic etching on the semiconductor layer through the mask pattern after the isotropic etching step so that etching progresses to the semiconductor substrate; and
   a step of separating the semiconductor substrate into chips after the anisotropic etching step, wherein
   the steps of isotropic etching and anisotropic etching form trenches through the semiconductor layer such that bottom surfaces of the trenches are concaves having a circular-arc sectional shape and side surfaces of the trenches are perpendicular to the semiconductor substrate, and
   the circular-arc sectional shape of the bottom surfaces of the trenches inhibits splitting of the semiconductor substrate from a point on peripheries of the trenches during the step of separating the semiconductor substrate into chips.

2. The method of manufacturing a semiconductor device according to claim 1, wherein the semiconductor layer includes a current blocking layer in contact with side surfaces of the mesa stripe, and a contact layer on the mesa stripe and the current blocking layer;
   the concaves having a circular-arc sectional shape are formed in the contact layer in the isotropic etching step; and
   side surfaces of the current blocking layer appearing as a result of the anisotropic etching step are perpendicular to the semiconductor substrate.

3. The method of manufacturing a semiconductor device according to claim 1, wherein the isotropic etching step is wet processing; and
   the anisotropic etching step is dry processing.

4. The method of manufacturing a semiconductor device according to claim 3, wherein the semiconductor layer is formed of an InP-based material; and
   an etchant containing Br and $CH_3OH$ is used in the isotropic etching step.

5. The method of manufacturing a semiconductor device according to claim 1, wherein the step of separating the semiconductor substrate into chips includes performing dicing along a dicing line that is spaced apart from the trenches.

6. A method of manufacturing a semiconductor device, comprising:
   a growth step of growing, on a semiconductor substrate, a mesa stripe including an active layer, and a semiconductor layer covering the mesa stripe;
   a masking step of forming, on the semiconductor layer, a mask pattern through which the semiconductor layer is exposed on opposite sides of the mesa stripe;
   an anisotropic etching step of performing anisotropic etching on the semiconductor layer exposed through the mask pattern so that etching progresses to the semiconductor substrate, and simultaneously forming a protective film on side surfaces of the semiconductor layer formed by etching;
   an isotropic etching step of isotropically etching the semiconductor substrate by such etching that the rate of etching on the semiconductor substrate is higher than the rate of etching on the protective film; and
   a step of separating the semiconductor substrate into chips after the isotropic etching step, wherein
   the steps of isotropic etching and anisotropic etching form trenches through the semiconductor layer such that bottom surfaces of the trenches are concaves having a circular-arc sectional shape and side surfaces of the trenches are perpendicular to the semiconductor substrate, and
   the circular-arc sectional shape of the bottom surfaces of the trenches inhibits splitting of the semiconductor substrate from a point on peripheries of the trenches during the step of separating the semiconductor substrate into chips.

7. The method of manufacturing a semiconductor device according to claim 6, wherein an etching gas containing silicon is used in the anisotropic etching step; and
   the protective film is a film containing silicon.

8. The method of manufacturing a semiconductor device according to claim 6, wherein the mask pattern is a resist; and
   the protective film is a film containing the resist.

9. The method of manufacturing a semiconductor device according to claim 6, wherein the step of separating the substrate into chips includes performing dicing along a dicing line that is spaced apart from the trenches.

* * * * *